(12) United States Patent
Leobandung

(10) Patent No.: US 9,502,500 B2
(45) Date of Patent: Nov. 22, 2016

(54) FORMING MULTI-STACK NANOWIRES USING A COMMON RELEASE MATERIAL

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/795,509

(22) Filed: Jul. 9, 2015

(65) Prior Publication Data

US 2016/0293699 A1 Oct. 6, 2016

Related U.S. Application Data

(63) Continuation of application No. 14/673,098, filed on Mar. 30, 2015.

(51) Int. Cl.
| | |
|---|---|
| *H01L 29/06* | (2006.01) |
| *H01L 29/66* | (2006.01) |
| *H01L 29/423* | (2006.01) |
| *H01L 21/02* | (2006.01) |

(52) U.S. Cl.
CPC ..... *H01L 29/0673* (2013.01); *H01L 21/02532* (2013.01); *H01L 29/42392* (2013.01); *H01L 29/66545* (2013.01)

(58) Field of Classification Search
None
See application file for complete search history.

(56) References Cited

U.S. PATENT DOCUMENTS

| 8,110,458 B2 | 2/2012 | Jin et al. |
|---|---|---|
| 8,183,104 B2 | 5/2012 | Hobbs et al. |
| 8,513,125 B2 | 8/2013 | Saracco et al. |
| 2011/0070734 A1 | 3/2011 | Saracco et al. |
| 2013/0270512 A1 | 10/2013 | Radosavljevic et al. |
| 2014/0001441 A1* | 1/2014 | Kim ................ H01L 29/0673 257/29 |
| 2014/0264280 A1* | 9/2014 | Kim ................ H01L 29/785 257/29 |

OTHER PUBLICATIONS

S.R. Huang et al., "Gap Films Grown on Si by Liquid Phase Epitaxy," 34th IEEE Photovoltaic Specialists Conference (PVSC), Jun. 2009, pp. 000241-000243.
List of IBM Patents or Patent Applications Treated as Related.

* cited by examiner

*Primary Examiner* — Daniel Luke
(74) *Attorney, Agent, or Firm* — Louis J. Percello; Ryan, Mason & Lewis, LLP

(57) ABSTRACT

A method for forming a multi-stack nanowire device includes forming a common release layer on a substrate, the common release layer comprising a common release material. The method also includes forming a first multi-layer stack on a first portion of the common release layer, the first multi-layer stack comprising at least two layers separated by at least one layer comprising the common release material, and forming a second multi-layer stack on a second portion of the common release layer, the second multi-layer stack comprising at least two layers separated by at least one layer comprising the common release material. The method further includes patterning each of the first multi-layer stack and the second multi-layer stack into one or more fins and forming two or more multi-stack nanowires from the one or more fins by removing the common release material using a common etch process.

16 Claims, 15 Drawing Sheets

GATE
190

100

300

800

1000

1100

1200

1300

SOURCE/DRAIN
180-2

1400

1500

FORMING MULTI-STACK NANOWIRES USING A COMMON RELEASE MATERIAL

CROSS-REFERENCE TO RELATED APPLICATION

This application is a Continuation of U.S. patent application Ser. No. 14/673,098 filed on Mar. 30, 2015, the disclosure of which is incorporated herein by reference in its entirety.

FIELD

The present application relates to the field of semiconductor device manufacturing and, more particularly, to forming nanowires.

BACKGROUND

Semiconductor nanowires are becoming a major research focus in nanotechnology. Various methods of forming metal-oxide-semiconductor field-effect transistors (MOSFETs) comprising nanowires have been explored, including the use of dual material nanowire, where different material nanowires are used for N-channel field-effect transistor (NFET) and P-channel field-effect transistor (PFET) devices. For example, silicon (Si) nanowires may be used as the channel material for the NFET devices, while silicon germanium (SiGe) nanowires may be used as the channel material for the PFET devices. As another example, multiple-stacked ("multi-stack") nanowires have been used in forming NFET and PFET devices, having the advantage of increasing the current carrying capability of these devices.

SUMMARY

Embodiments of the invention provide techniques for forming nanowires.

For example, in one embodiment, a method comprises forming a common release layer on a substrate, the common release layer comprising a common release material. The method also comprises forming a first multi-layer stack on a first portion of the common release layer, the first multi-layer stack comprising at least two layers separated by at least one layer comprising the common release material and forming a second multi-layer stack on a second portion of the common release layer, the second multi-layer stack comprising at least two layers separated by at least one layer comprising the common release material. The method further comprises patterning each of the first multi-layer stack and the second multi-layer stack into one or more fins and forming two or more multi-stack nanowires from the one or more fins by removing the common release material using a common etch process. In another example, a multi-stack nanowire device is formed according to the above method. In a further example, an integrated circuit comprises two or more multi-stack nanowire devices formed according to the above method.

Advantageously, embodiments of the invention provide methods of forming dual material nanowires using a common release layer.

These and other features, objects and advantages of the present invention will become apparent from the following detailed description of illustrative embodiments thereof, which is to be read in connection with the accompanying drawings.

DETAILED DESCRIPTION

Illustrative embodiments of the invention will be described herein with reference to particular methods and apparatus. It is to be appreciated, however, that the invention is not limited to the specific methods and apparatus illustratively shown and described herein. Rather, embodiments of the invention are directed more broadly to techniques for generating both NFET and PFET multi-stack nanowire devices. Moreover, it will become apparent to those skilled in the art given the teachings herein that numerous modifications can be made to the embodiments shown that are within the scope of the present invention. That is, no limitations with respect to the specific embodiments described herein are intended or should be inferred.

A multi-stack Si/SiGe structure may be used to generate multi-stack nanowire devices. Such multi-stack nanowire devices may include one or more PFET devices and one or more NFET devices, where the PFET devices comprise SiGe nanowire and the NFET devices comprise Si nanowire. However, it is difficult to form dual material nanowire devices using conventional methods because the release layer used, typically SiGe, is the same as the channel material for the PFET devices. If SiGe is used to release Si nanowire in the NFET devices, it is difficult to form the SiGe nanowire in the PFET devices. Illustrative embodiments described herein utilize an integration scheme using a common release material for both Si and SiGe nanowires.

An illustrative embodiment for forming a multi-stack nanowire device will be described below with reference to FIGS. 1-15. Each of the structures 100 to 1500 illustrate steps which may be used in the process of forming a multi-stack nanowire device.

Figure 1A:
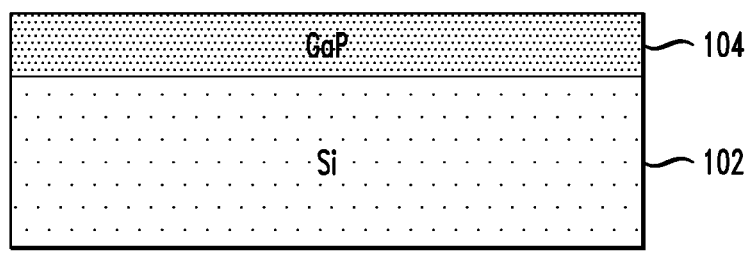
FIGS. 1A and 1B illustrate a side view and a top view, respectively, of a silicon substrate having a common release layer deposited thereon, according to an embodiment of the invention.
Figure 1B:
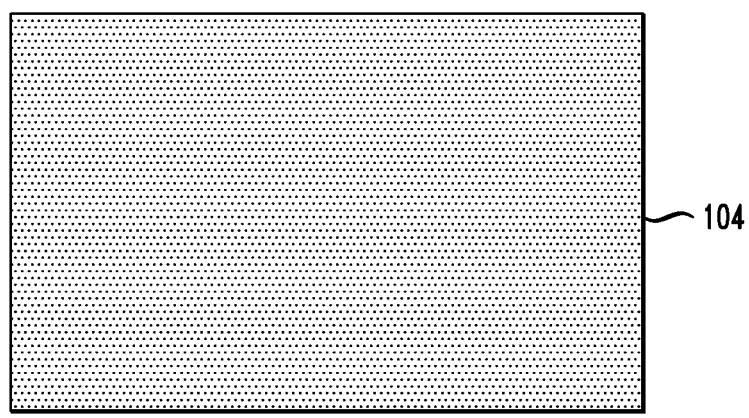

FIGS. 1A and 1B are side and top views, respectively, illustrating formation of the structure 100, which includes a Si substrate 102 having a common release layer 104. In FIGS. 1A and 1B, the common release layer 104 comprises gallium phosphide (GaP) deposited onto the Si substrate 102. The lattice structure of GaP matches that of the Si substrate 102. Embodiments, however, are not limited solely to a common release layer 104 comprising GaP. More generally, other materials may be used so long as the lattice structure of the common release layer 104 matches that of the Si substrate 102 such that the common release layer 104 can be etched selective to the Si and SiGe.

Figure 2A:
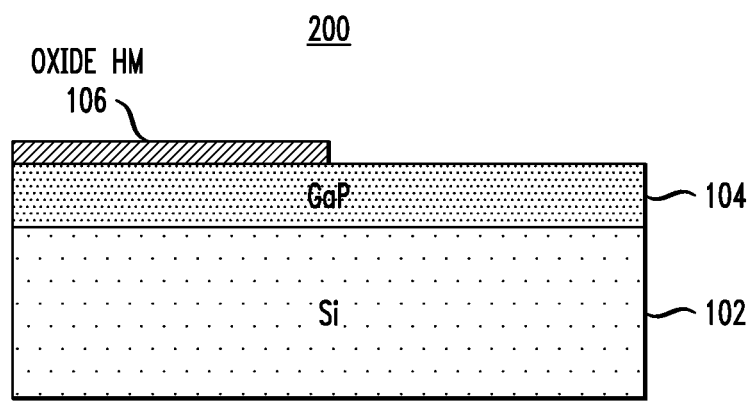
FIGS. 2A and 2B illustrate a side view and a top view, respectively, of the structure of FIGS. 1A and 1B after a mask is deposited over the common release layer and selectively removed over the area in which a PFET is to be formed, according to an embodiment of the invention.
Figure 2B:
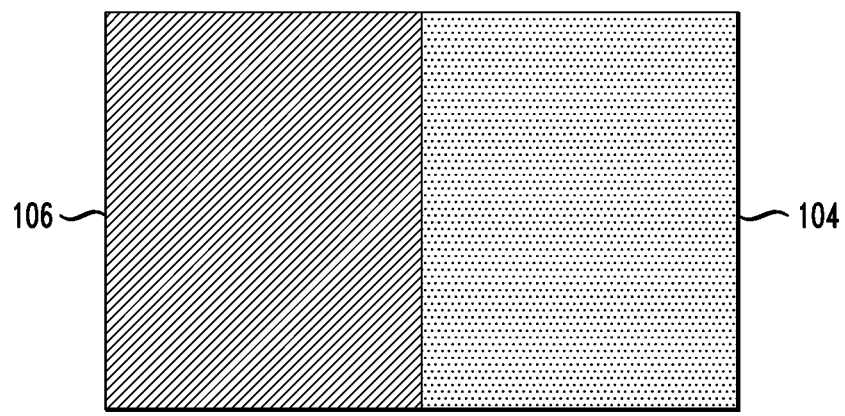

FIGS. 2A and 2B depicts the next step in forming the multi-stack nanowire device, where an oxide hard mark (HM) 106 is formed over a portion of the common release layer 104 of structure 100 resulting in structure 200. The oxide HM 106 may initially be formed over the entire common release layer 104, and selectively removed in the area or areas in which a PFET stacked nanowire device is to be formed. Although the resulting oxide HM 106 is shown in FIGS. 2A and 2B on a left side of the common release layer 104, embodiments are not so limited. The resulting oxide HM 106 may be on the right side, or in a middle portion of the common release layer 104 in other embodiments. In addition, the resulting oxide HM 106 may be formed such that the resulting oxide HM 106 leaves multiple noncontiguous areas of the common release layer 104 exposed. The portion or portions of the common release layer 104 covered by oxide HM 106 are referred to herein as the NFET region or regions, while the portion or portions of common release layer 104 left exposed by the resulting oxide HM 106 are referred to herein as the PFET region or regions.

Figure 3A:
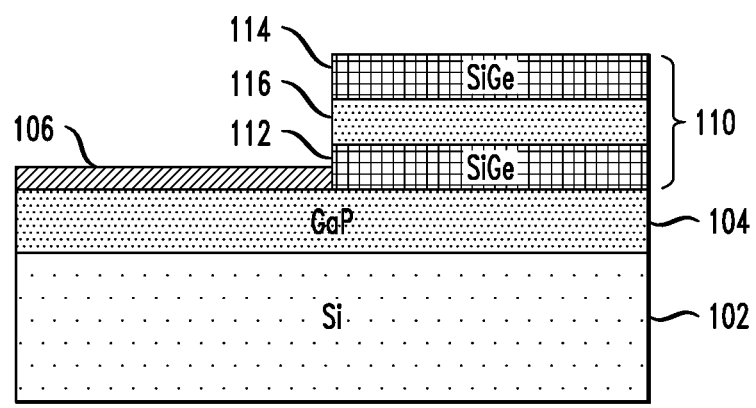
FIGS. 3A and 3B illustrate a side view and a top view, respectively, of the device of FIGS. 2A and 2B after growth of a PFET nanowire stack, according to an embodiment of the invention.
Figure 3B:
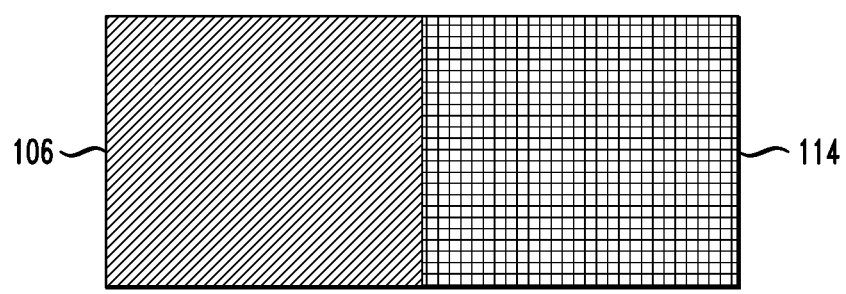

As shown in side and top views of structure 300 in FIGS. 3A and 3B, a PFET stack 110 is grown over the exposed common release layer 104, i.e., the area not covered by oxide HM 106, of structure 200. In this embodiment, the PFET stack 110 comprises two SiGe layers 112 and 114 separated by common release layer 116, which comprises the same material as common release layer 104. It should be noted that while FIG. 3A shows a multi-stack comprising two SiGe layers, multi-stacks may include three or more layers of SiGe separated by common release layers in other embodiments.

Figure 4A:
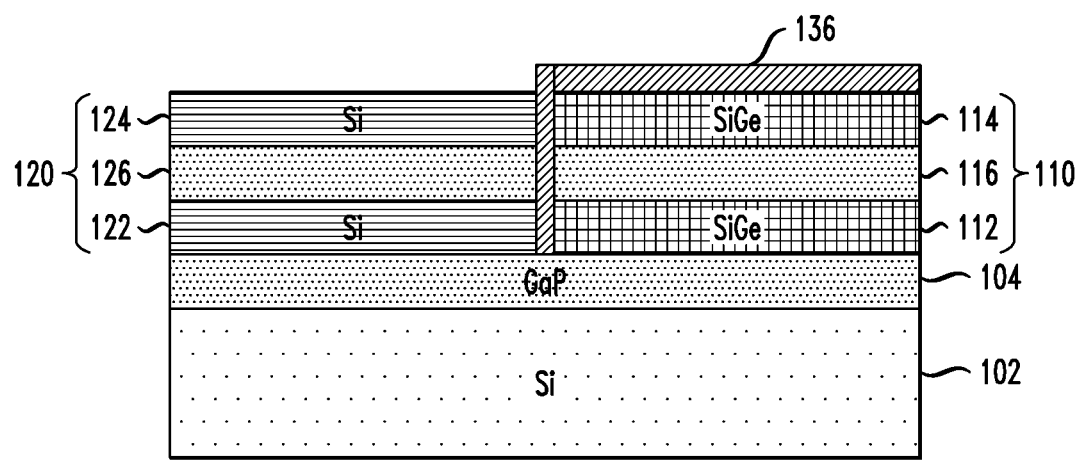
FIGS. 4A and 4B illustrate a side view and a top view, respectively, of the device of FIGS. 3A and 3B after growth of an NFET nanowire stack, according to an embodiment of the invention.
Figure 4B:
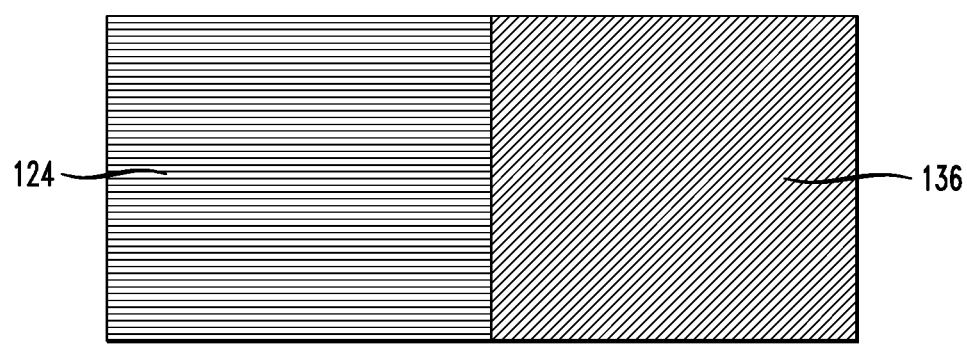

In the following step, as shown in the side and top views of structure 400 in FIGS. 4A and 4B, oxide HM 106 is removed from the NFET region and oxide layer 136 is formed over the PFET region. A NFET stack 120 is then grown over the exposed portion of the common release layer 104 in the NFET region. In this embodiment, the NFET stack comprises two Si layers 122 and 124 separated by common release layer 126, which comprises the same material as common release layers 104 and 116. It should be noted that while FIG. 4A shows a multi-stack comprising two Si layers, multi stacks having three or more layers of Si separated by common release layers may be used in other embodiments.

It is important to note that while the method thus far was described forming the PFET stack followed by the NFET stack, embodiments are not so limited. In other embodiments, the NFET stack may be formed prior to the PFET stack. In addition, multiple PFET and/or NFET stacks may be formed rather than a single PFET stack and a single NFET stack. Further, the PFET and NFET stacks are not limited solely to being formed of SiGe and Si, respectively. Instead, various other materials may be used, including but not limited to indium, gallium, arsenic, other period III-V materials and groups II-IV materials.

Figure 5A:
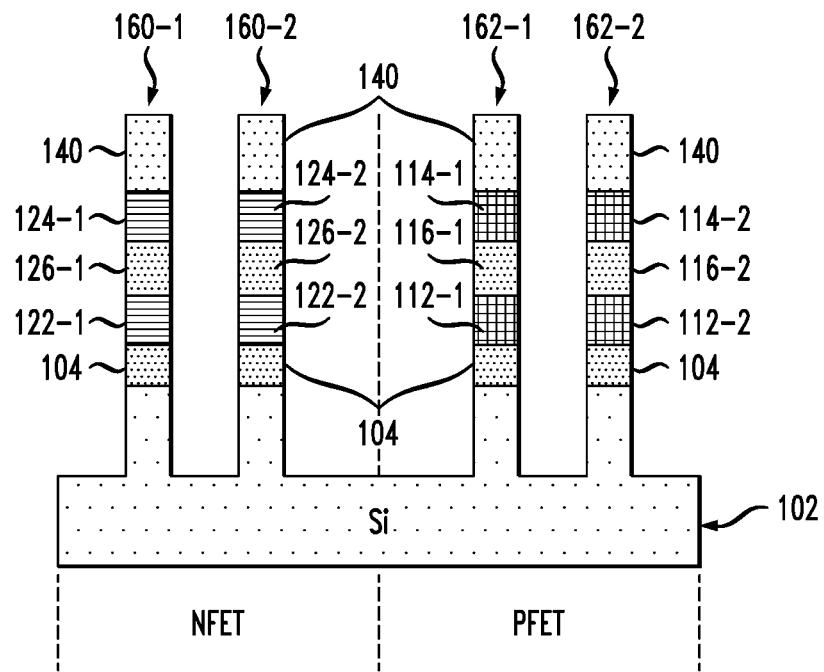
FIGS. 5A and 5B illustrate a cross-sectional and a top view, respectively, of the device of FIGS. 4A and 4B after patterning of fins with a hard mask, according to an embodiment of the invention.
Figure 5B:
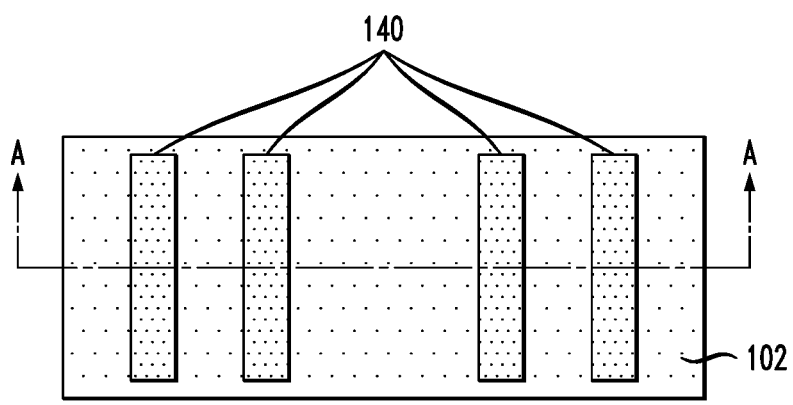

FIGS. 5A and 5B show a cross-sectional view taken along section AA and a top view of structure 500, respectively, after the oxide layer 136 is removed from the PFET region and a hard mask 140 comprising, for example, nitride is used to pattern fins 160-1, 160-2, 162-1 and 162-2. After etching, the resulting fin structures 160-1 and 160-2 in the NFET region each comprise layers of Si 122 and 124 separated by common release layer 126. Similarly, the resulting fin structures 162-1 and 162-2 in the PFET region each comprise layers of SiGe 112 and 114 separated by common release layer 116. The nitride HM 140 remains on top of each of the fin structures 160-1, 160-2, 162-1 and 162-2. While shown in FIG. 5A as forming two NFET fin 160-1 and 160-2 and two PFET fins 162-1 and 162-2, embodiments are not limited solely to a multi-stack structure having two NFET fins and two PFET fins. In other embodiments, more or less than two NFET and two PFET fins may be formed.

Figure 6A:
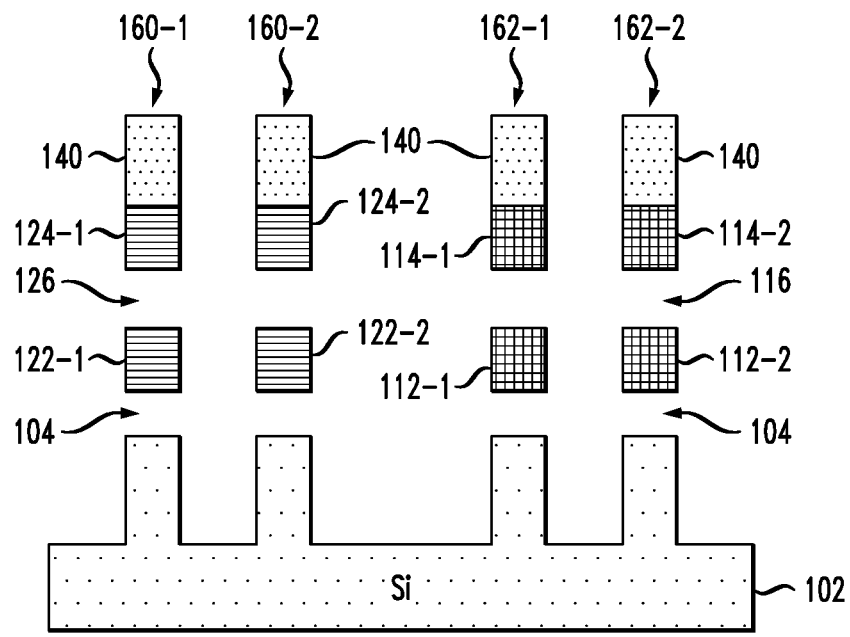
FIGS. 6A and 6B illustrate a cross-sectional view and a top view, respectively, the device of FIGS. 5A and 5B after etching of the common release layers, according to an embodiment of the invention.
Figure 6B:
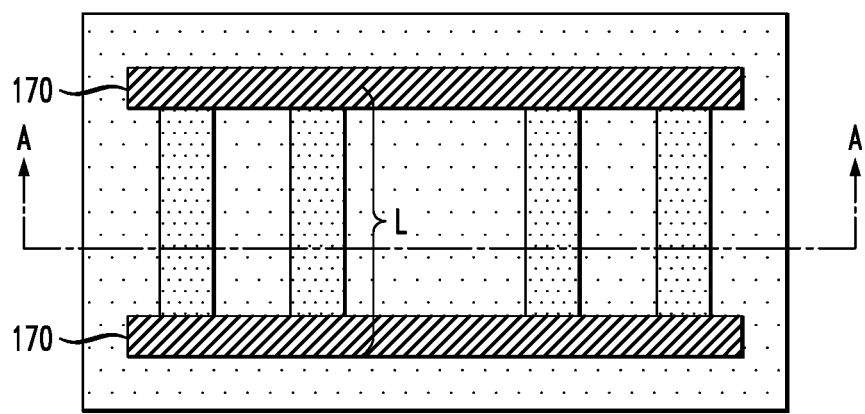

Next, FIGS. 6A and 6B show a cross-sectional view taken along section AA and a top view of structure 600, respectively. As shown, the common release layers 104, 116 and 126 are removed, leaving PFET nanowires 112-1 and 114-1 suspended in fin 162-1, PFET nanowires 112-2 and 114-2 suspended in fin 162-2, NFET nanowires 122-1 and 124-1 suspended in fin 160-1, and NFET nanowires 122-2 and 124-2 suspended in fin 160-2. A typical length L of the suspension may be approximately 250 nm but can be longer or shorter depending on the requirements for a particular device. The removal of the common release layers 104, 116 and 126 may be performed using a wet etch selective to Si/SiGe, for example, using a composition of hydrochloric acid, acetic acid and hydrogen peroxide in equal amounts (HCL:CH3COOH:H2O2 (1:1:1)). Embodiments, however, are not limited solely to use of this specific wet etch. Instead, various other types of etches and processes may be used to remove the common release layers 104, 116 and 126.

As shown in FIG. 6B, an anchor layer 170 is deposited at the ends of the fins 160-1, 160-2, 162-1 and 162-2 to keep the suspended nanowires in place. That is, when the common release layers 104, 116 and 126 are removed via the wet etch, the NFET nanowires 122-1, 124-1, 122-2 and 124-2 and the PFET nanowires 112-1, 114-1, 112-2 and 114-2 are released from their respective middles and not from their respective ends, which are anchored via the anchor layers 170. The anchor layer 170 could be an insulator, such as oxide or nitride, which is deposited, patterned and etch so it only remains at the anchor place. Other anchor materials can also be used as long as it does not interfere with the device. For clarity of illustration, the anchor layers 170 are not shown in the cross-sectional view of FIG. 6A to show the spaces left by removal of the common release layers 104, 116 and 126.

Figure 7A:
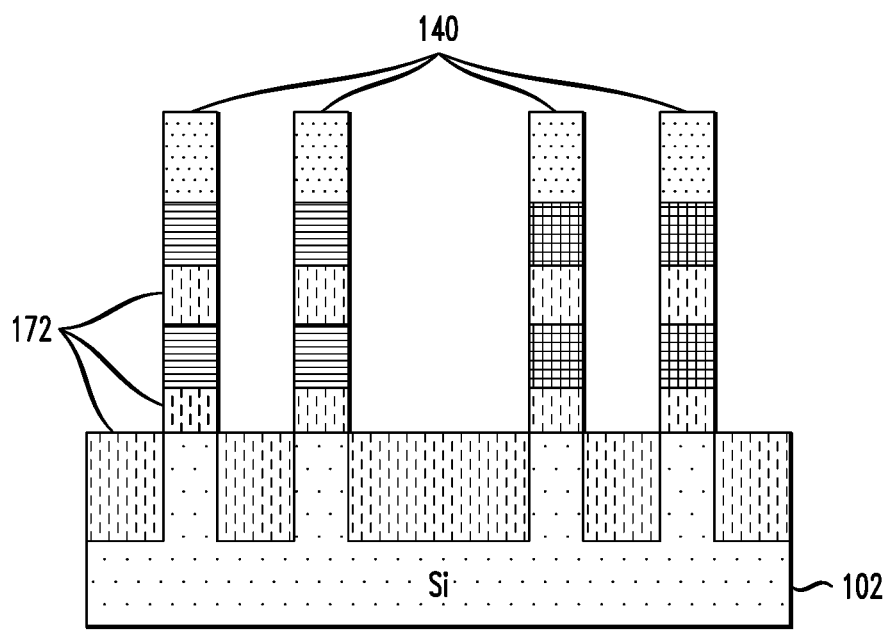
FIGS. 7A and 7B illustrate a cross-sectional view and a top view, respectively, of the device of FIGS. 6A and 6B after depositing an oxide to isolate the nanowires, according to an embodiment of the invention.
Figure 7B:
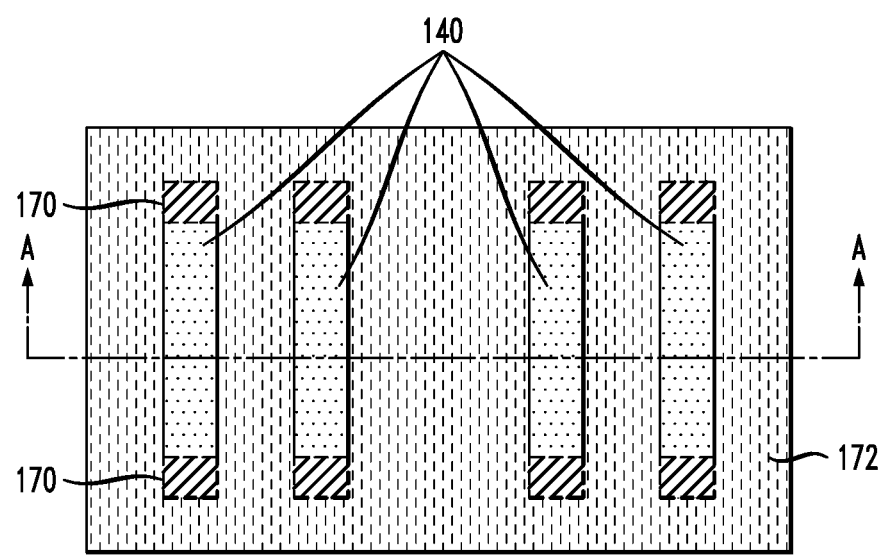

Subsequently, as depicted in FIGS. 7A and 7B, which shows a cross-sectional view taken along section AA and a top view of structure 700, respectively, the anchor layer 170 is patterned with any techniques known in the art. In the top view of FIG. 7B, the anchor layers 170 are shown in outlined in bold, dashed lines to indicate that they are not actually visible from the top view of FIG. 7B, but are instead shown for clarity of illustration. The nitride HM 140 remains on top of each fin 160-1, 160-2, 162-1 and 162-2, and an oxide 172 is deposited to form an isolation in the spaces between the NFET nanowires 122-1, 124-1, 122-2 and 124-2 and the PFET nanowires 112-1, 114-1, 112-2 and 114-2 left void by the removal of the common release layers 104, 116 and 126. Additionally, an anisotropic etch is used to recess the oxide 172 into the substrate 102 at the base of the fins 160-1, 160-2, 162-1 and 162-2.

Figure 8A:
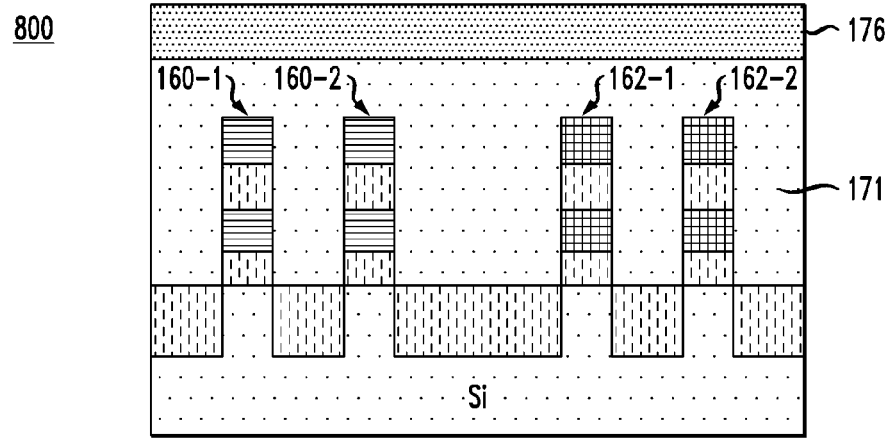
FIGS. 8A-8C illustrate a cross-sectional view taken along section AA, a top view and a cross-sectional view taken along section CC, respectively, of the device of FIGS. 7A and 7B after removal of the hard mask and deposition of dummy gates, according to an embodiment of the invention.
Figure 8B:
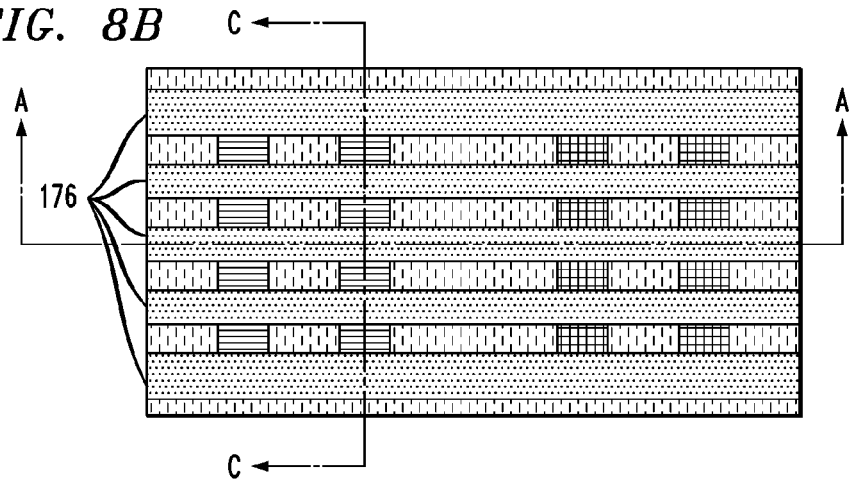
Figure 8C:
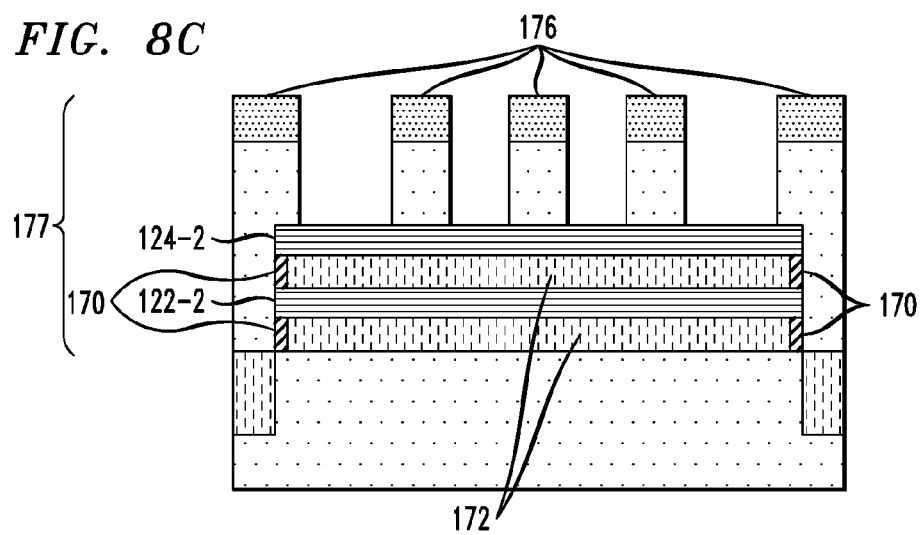

FIGS. 8A-8C show a cross-sectional view taken along section AA, a top-view and a cross-sectional view taken along section CC of structure 800, respectively. In this step, the nitride HM 140 is removed and dummy gates 177 are deposited over portions of the fin structures 160-1, 160-2, 162-1 and 162-2. The dummy gates 177 may comprise thin oxide (not shown), a Si layer 171 and an oxide or nitride hard mask 176. Other materials may also be used. The dummy gates 177 can be deposited as a blanket layer and then patterned using lithography and etch processes known in the art. FIG. 8B shows, as an example, five rows of dummy gates 177 (hard mask 176 is shown in top view FIG. 8B) deposited over portions of the two nanowires in the NFET region, 160-1 and 160-2, and over the two nanowires in the PFET region, 162-1 and 162-2. The dummy gates 177 are shown covering portions of the nanowires. In FIG. 8C, the stacked layers of the nanowires 122-2 and 124-2 in fin 160-2 are isolated by the oxide 172 in the NFET region as shown. The anchor layers 170 are shown at either ends anchoring the nanowires 122-2 and 124-2. Similarly, the stacked layers of the nanowires in fins 160-1, 162-1 and 162-2 are isolated by the oxide layers 172 and anchored by the anchor layers 170.

Figure 9:
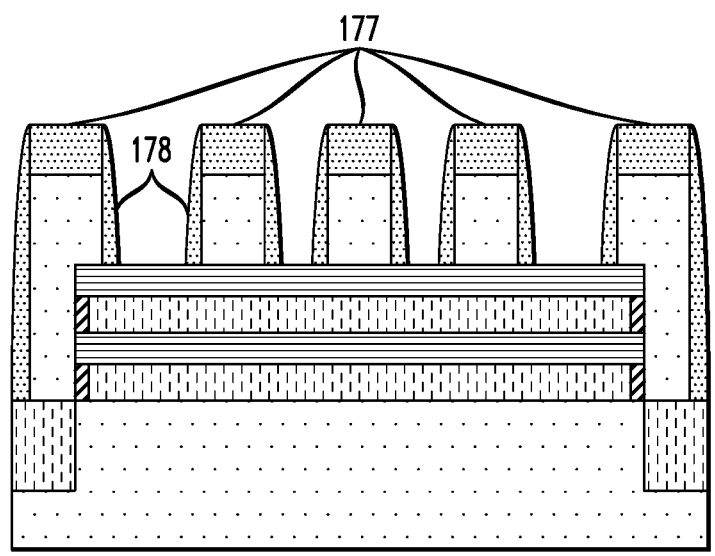
FIG. 9 illustrates a cross-sectional view of the device of FIGS. 8A-8C after deposition of thin spacers on the dummy gates, according to an embodiment of the invention.

FIG. 9 shows structure 900, which is a cross-sectional view of the structure 800 in FIG. 8C taken along section CC, following formation of a thin spacer 178 on both sides of the dummy gates 177. The thickness of thin spacer 178 can range from 1 nm to 20 nm, but may be any other suitable thickness. The thin spacers 178 are formed by depositing a thin insulator layer (such as oxide or nitride) and then anisotropically etching from the horizontal surface. Overetch will remove the spacer from the fin side wall. Thin spacers are also formed on the sides of the dummy gates for fins 160-1, 162-1 and 162-2.

Figure 10:
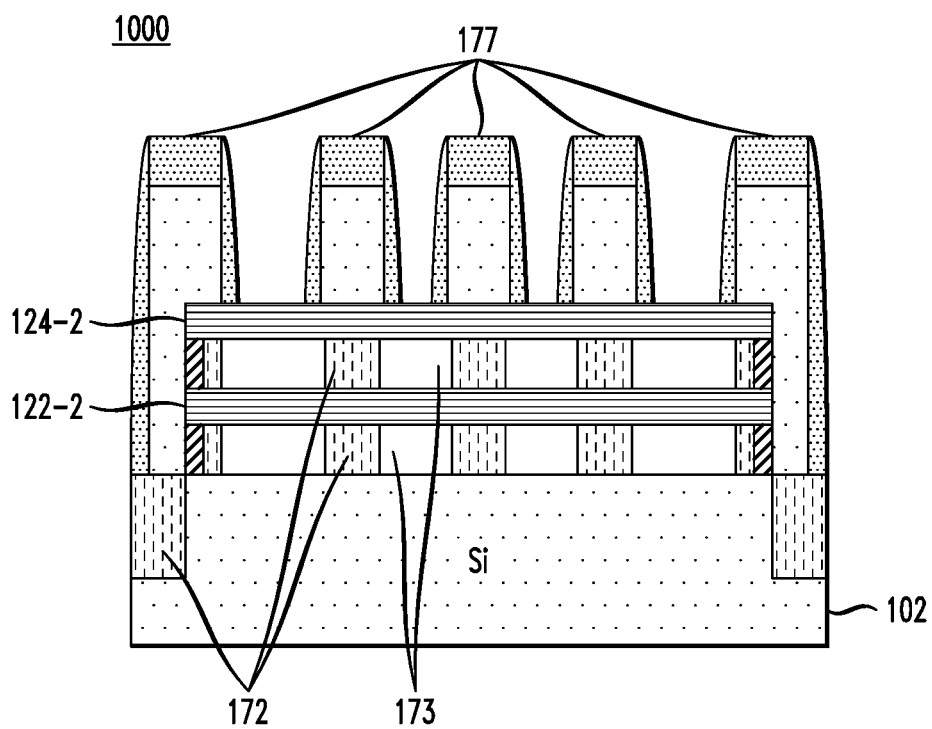
FIG. 10 illustrates a cross-sectional view of the device of FIG. 9 after etching portions of the oxide not covered by the dummy gates, according to an embodiment of the invention.

FIG. 10 shows structure 1000, which is a same cross sectional view as structure 900 in FIG. 9 after selectively removing the oxide 172 between the nanowire 122-2 and the nanowire 124-2, and removing the oxide 172 between the nanowire 122-2 and the Si substrate 102. That is, the oxide 172 in the regions not protected by the dummy gates 177 are removed, leaving gaps 173 as shown in FIG. 10. An anisotropic oxide etch process may be used to selectively remove the oxide 172. The oxide 172 is similarly selectively removed between the nanowire 122-1 and nanowire 124-1 and between the nanowire 122-1 and the Si substrate for FIN 160-1, and between the nanowires 112 and 114 and between the nanowires 112 and the Si substrate for fins 162-1 and 162-2.

Figure 11:
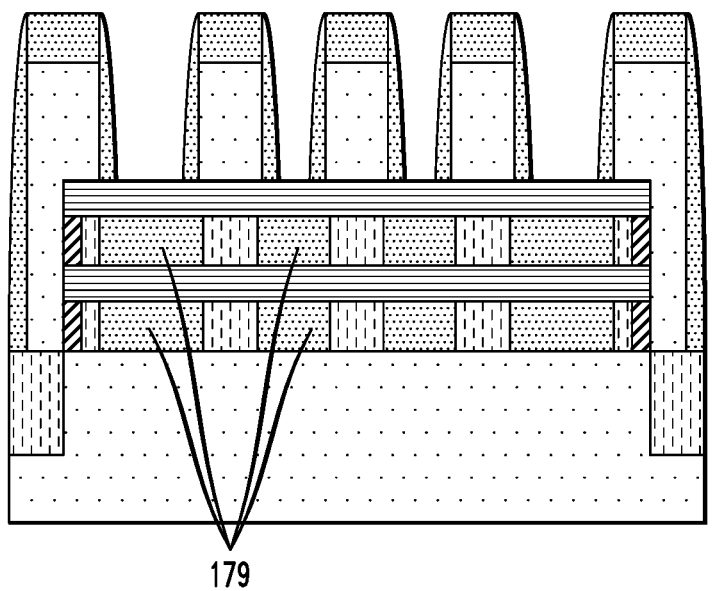
FIG. 11 illustrates a cross-sectional view of the device of FIG. 10 after depositing another thin spacer to fill in the gaps left from etching the portions of the oxide not covered by the dummy gates, according to an embodiment of the invention.

FIG. 11 shows structure 1100, which is a same cross sectional view as structure 1000 in FIG. 10 following formation of thin spacer 179. Thin spacer 179, which may be the same material as thin spacer 178, is deposited to fill the gaps 173 left by the oxide etch, as shown in FIG. 11.

Figure 12A:
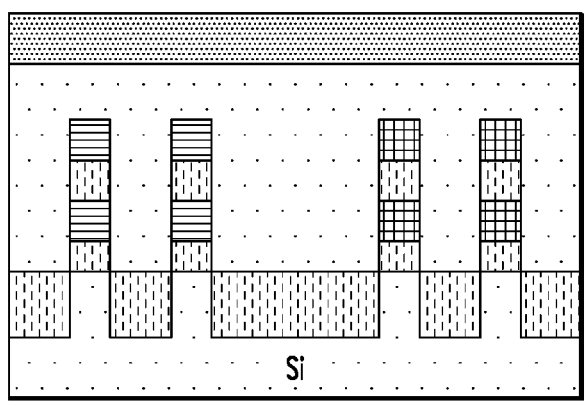
FIGS. 12A-12C illustrates a cross-sectional view taken along section AA, a top-view and a cross-sectional view taken along section CC, respectively, of the device of FIG. 11 after doping of source/drain regions, according to an embodiment of the invention.
Figure 12B:
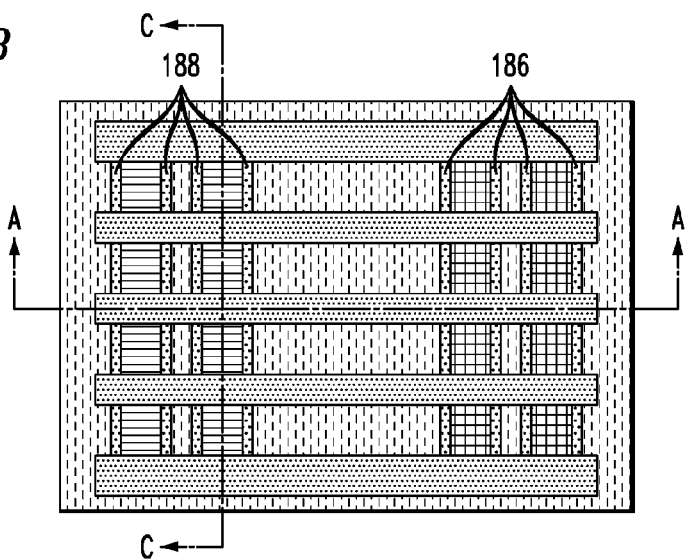
Figure 12C:
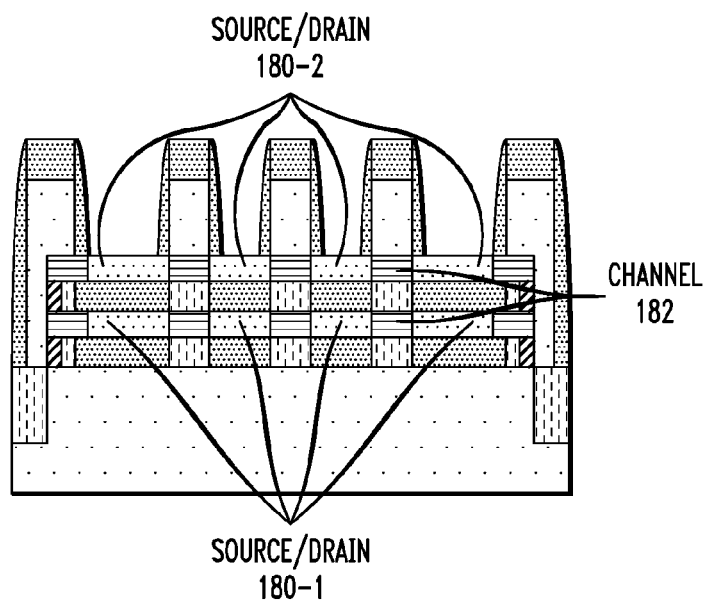

FIGS. 12A-12C show a cross-sectional view taken along section AA, a top-view and a cross-sectional view taken along section CC of structure 1200, respectively, illustrating doping of the nanowires to form source/drain regions 180-1 and 180-2. Portions of the nanowires are doped using, for example, epi or plasma doping in order to form the source/drain regions 180-1 and 180-2. N-type doping is used for the NFET devices in fins 160-1 and 160-2, and p-type doping is used for the PFET devices in fins 162-1 and 162-2. As shown in FIG. 12B, regions 188 and 186 are the source/drain growths which diffuse and convert nanowires that are not covered by dummy gates 177 into source/drain regions 180-1 and 180-2 shown in FIG. 12C. As shown in FIG. 12C the source/drain regions 180-1 and 180-2 of the nanowires are doped with the dummy gates 177 masking the channel regions 182.

Figure 13A:
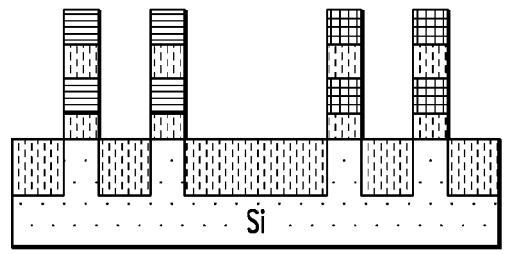
FIGS. 13A-13C illustrate a cross-sectional view taken along section AA, a top-view and a cross-sectional view taken along section CC, respectively, of the device of FIGS. 12A-12C after planarization with an insulator and removal of the dummy gates, according to an embodiment of the invention.
Figure 13B:
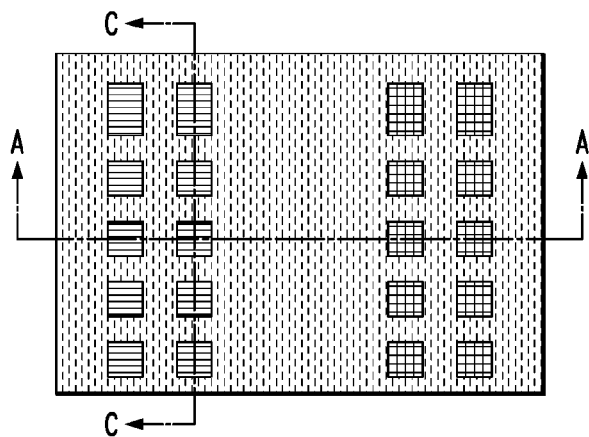
Figure 13C:
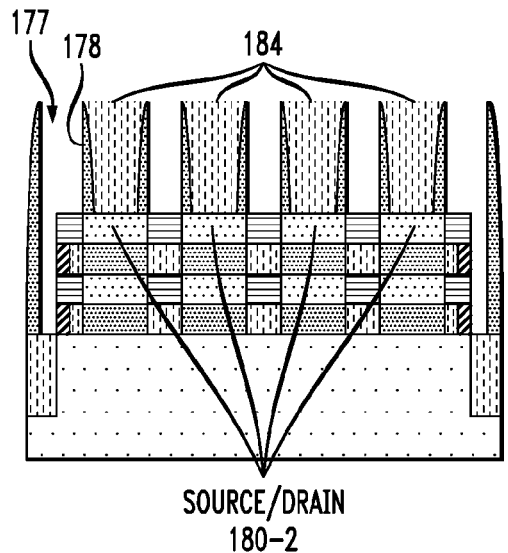

FIGS. 13A-13C show a cross-sectional view taken along section AA, a top-view and a cross-sectional view taken along section CC of structure 1300, respectively. As shown, the next step in the process of forming a multi-stack nanowire device comprises forming an insulator 184 over the spaces between the dummy gates 177 and above the source/drain regions 180-2. The insulator 184 may be, for example, an oxide. The top surface of the structure 1300 is planarized. After planarization, the dummy gates 177 are removed, but the thin spacers 178 remain. For clarity of illustration, the insulator 184 and thin spacers 178 are not shown in the view of FIG. 13A.

Figure 14A:
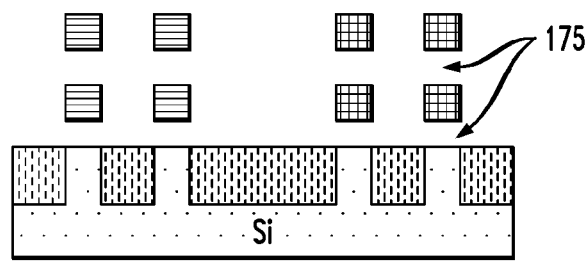
FIGS. 14A-14C illustrate a cross-sectional view taken along section AA, a top-view and a cross-sectional view taken along section CC, respectively, of the device of FIGS. 13A-13C after removal of remaining portions of the oxide, according to an embodiment of the invention.
Figure 14B:
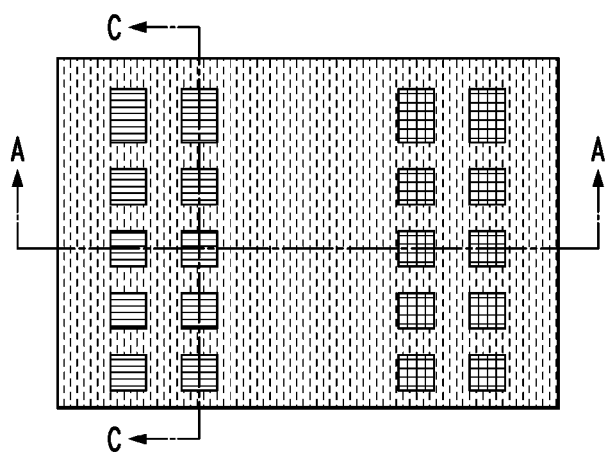
Figure 14C:
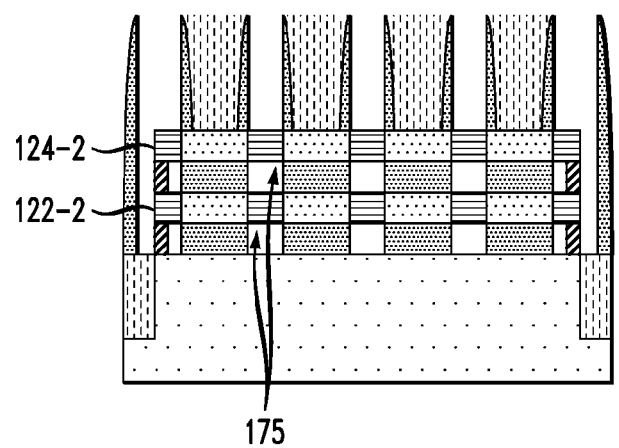

FIGS. 14A-14C show a cross-sectional view taken along section AA, a top-view and a cross-sectional view taken along section CC of structure 1400, respectively. After removal of the dummy gates 177, the remaining oxide 172 between the nanowires 122-2 and 124-2 is removed leaving spaces 175. The oxide 172 remaining between the nanowires 122-2 and 124-2 in the channel regions may be removed using a wet etch process. Although not explicitly shown, the oxide 172 remaining between nanowires 122-1 and 124-1 of fin 160-1, and oxide 172 remaining between nanowires 112 and 114 of fins 162-1 and 162-2 is also removed. For clarity of illustration, the insulator 184 and thin spacers 178 are again not shown in the view of FIG. 14A.

Figure 15A:
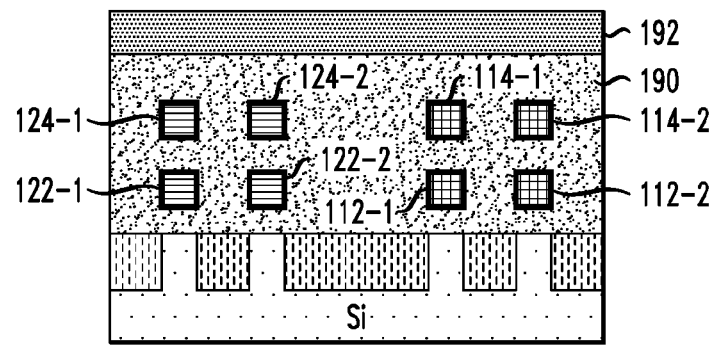
FIGS. 15A-15C illustrate a cross-sectional view taken along section AA, a top-view and a cross-sectional view taken along section CC, respectively, of the device of FIGS. 14A-14C after formation of gates, according to an embodiment of the invention.
Figure 15B:
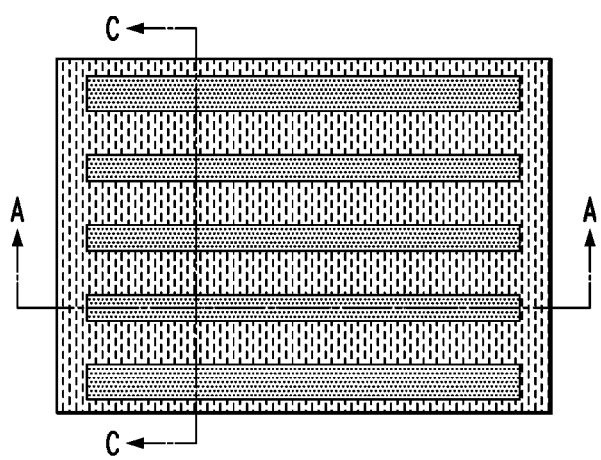
Figure 15C:
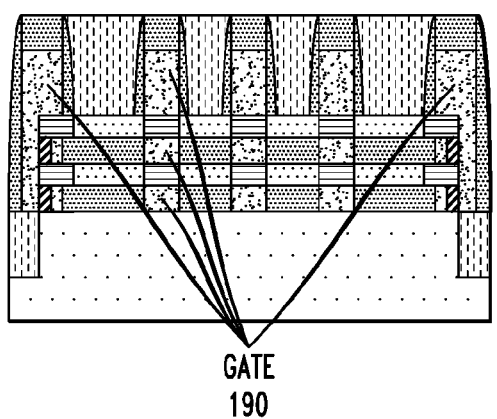

FIGS. 15A-15C show a cross-sectional view taken along section AA, a top-view and a cross-sectional view taken along section CC of structure 1500, respectively. The spaces 175, shown in FIG. 14C, left by the removal of the oxide 172 are replaced with gates 190 as shown in FIGS. 15A-15C. The gates 190 may be, for example, a high-k gate material such as hafnium oxide ($HfO_2$), zirconium oxide ($ZrO_2$) or lanthanum oxide ($La_2O_3$), a work function metal such as titanium nitride (TiN) or tantalum nitride (TaN), and/or gate metal such as tungsten or aluminum. The gates 190 fill up the spaces surrounding the nanowires, thereby completely wrapping around the nanowires 112-1, 112-2, 114-1, 114-2, 122-1, 122-2, 124-1 and 124-2 in the channel region, as shown in FIG. 15A. Gate cap 192 is then deposited onto the gates 190. Gate cap 192 may comprise a dielectric such as, for example, silicon nitride and silicon oxide. Finally, contacts (not shown) are formed to the gate/source/drain using processes known in the art.

Figure 16:
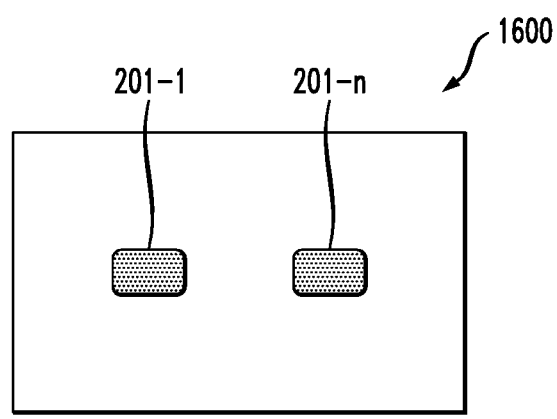
FIG. 16 illustrates an integrated circuit comprising one or more multi-stack nanowire devices, according to an embodiment of the invention.

FIG. 16 shows an integrated circuit 1600, which comprises one or more multi-stacked nanowire devices 201-1 through 201-*n*, where n is an integer, according to embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention. Although illustrative embodiments of the present invention have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method comprising:
    forming a common release layer on a substrate, the common release layer comprising a common release material;
    forming a first multi-layer stack on a first portion of the common release layer, the first multi-layer stack comprising at least two layers separated by at least one layer comprising the common release material;
    forming a second multi-layer stack on a second portion of the common release layer, the second multi-layer stack comprising at least two layers separated by at least one layer comprising the common release material;
    patterning each of the first multi-layer stack and the second multi-layer stack into one or more fins; and
    forming two or more multi-stack nanowires from the one or more fins by removing the common release material using a common etch process;
    wherein the first multi-layer stack comprises:
        a first layer comprising a first material;
        a second layer formed over the first layer, the second layer comprising the common release material; and
        a third layer formed over the second layer, the third layer comprising the first material;
    wherein the second multi-layer stack comprises:
        a fourth layer comprising a second material;
        a fifth layer formed over the fourth layer, the fourth layer comprising the common release material; and
        a sixth layer formed over the fifth layer, the sixth layer comprising the second material; and
    wherein the first material is different than the second material.

2. The method of claim 1, wherein the common release material is gallium phosphide, the first material is silicon germanium and the second material is silicon.

3. A method comprising:
    forming a common release layer on a substrate, the common release layer comprising a common release material;
    forming a first multi-layer stack on a first portion of the common release layer, the first multi-layer stack comprising at least two layers separated by at least one layer comprising the common release material;
    forming a second multi-layer stack on a second portion of the common release layer, the second multi-layer stack comprising at least two layers separated by at least one layer comprising the common release material;
    patterning each of the first multi-layer stack and the second multi-layer stack into one or more fins; and
    forming two or more multi-stack nanowires from the one or more fins by removing the common release material using a common etch process;
    wherein forming the first multi-layer stack comprises:
        depositing an oxide layer on the second portion of the common release layer; and
        forming the first multi-stack layer on the first portion of the common release layer.

4. The method of claim 3, wherein forming the second multi-layer stack comprises:
    removing the oxide layer deposited on the second portion of the common release layer;
    depositing another oxide layer on the first multi-layer stack; and
    forming the second multi-layer stack on the second portion of the common release layer.

5. The method of claim 1, wherein patterning each of the first multi-layer stack and the second multi-layer stack comprises utilizing a hard mask formed over portions of the first multi-layer stack and the second multi-layer stack.

6. The method of claim 5, further comprising:
    depositing an anchor layer at ends of each of the one or more fins; and
    removing the common release material on the substrate, in the first multi-layer stack and in the second multi-layer stack.

7. The method of claim 6, further comprising depositing an oxide in one or more spaces formed by removal of the common release material.

8. The method of claim 7, further comprising:
    removing the hard mask formed over portions of the first and second multi-layer stack; and forming a plurality of dummy gates on portions of the two or more multi-stack nanowires.

9. The method of claim 8, further comprising forming thin spacers on sides of each of the plurality of dummy gates.

10. The method of claim 9, further comprising:
selectively removing a first portion of the oxide in regions between the two or more multi-stack nanowires not covered by the plurality of dummy gates and in regions between the two or more multi-stack nanowires and the substrate not covered by the plurality of dummy gates; and
depositing a thin spacer to fill in one or more spaces left by removal of the first portion of the oxide.

11. The method of claim 10, further comprising forming source/drain regions by doping portions of the two or more multi-stack nanowires not covered by the plurality of dummy gates.

12. A method comprising:
forming a common release layer on a substrate, the common release layer comprising a common release material;
forming a first multi-layer stack on a first portion of the common release layer, the first multi-layer stack comprising at least two layers separated by at least one layer comprising the common release material;
forming a second multi-layer stack on a second portion of the common release layer, the second multi-layer stack comprising at least two layers separated by at least one layer comprising the common release material;
patterning each of the first multi-layer stack and the second multi-layer stack into one or more fins;
forming two or more multi-stack nanowires from the one or more fins by removing the common release material using a common etch process;
wherein patterning each of the first multi-layer stack and the second multi-layer stack comprises utilizing a hard mask formed over portions of the first multi-layer stack and the second multi-layer stack;
depositing an anchor layer at ends of each of the one or more fins;
removing the common release material on the substrate, in the first multi-layer stack and in the second multi-layer stack;
depositing an oxide in one or more spaces formed by removal of the common release material;
removing the hard mask formed over portions of the first and second multi-layer stack;
forming a plurality of dummy gates on portions of the two or more multi-stack nanowires;
forming thin spacers on sides of each of the plurality of dummy gates;
selectively removing a first portion of the oxide in regions between the two or more multi-stack nanowires not covered by the plurality of dummy gates and in regions between the two or more multi-stack nanowires and the substrate not covered by the plurality of dummy gates;
depositing a thin spacer to fill in one or more spaces left by removal of the first portion of the oxide; and
forming source/drain regions by doping portions of the two or more multi-stack nanowires not covered by the plurality of dummy gates;
wherein n-type doping is used for forming source/drain regions in portions of the two or more multi-stack nanowires in the one or more fins patterned from the first multi-layer stack and wherein p-type doping is used for forming source/drain regions in portions of the two or more multi-stack nanowires in the one or more fins patterned from the second multi-layer stack.

13. The method of claim 11, further comprising:
forming an insulator in spaces between the plurality of dummy gates and above the source/drain regions;
planarizing the top surface of the insulator; and
removing the plurality of dummy gates.

14. The method of claim 13, further comprising removing a second portion of the oxide in regions between the two or more multi-stack nanowires not covered by the insulator.

15. The method of claim 14, further comprising forming a gate stack by depositing a gate material to fill in spaces surrounding the two or more multi-stack nanowires, wherein the gate stack is completely wrapped around the two or more multi-stack nanowires.

16. The method of claim 15, further comprising depositing a gate cap onto the gate stack.

* * * * *